United States Patent [19]

Schleupen et al.

[11] Patent Number: 5,517,543

[45] Date of Patent: May 14, 1996

[54] CIRCUIT DEVICE FOR CONTROLLING CIRCUIT COMPONENTS CONNECTED IN SERIES OR IN A MATRIX-LIKE NETWORK

[75] Inventors: Kai Schleupen, Echterdingen; Ernst Lüder, Stuttgart, both of Germany

[73] Assignee: Ernst Lueder, Stuttgart, Germany

[21] Appl. No.: 207,758

[22] Filed: Mar. 8, 1994

[30] Foreign Application Priority Data

Mar. 8, 1993 [DE] Germany ............... 43 07 177.5

[51] Int. Cl.[6] ............................... G11C 19/28
[52] U.S. Cl. ............... 377/79; 377/74; 345/197
[58] Field of Search .............. 377/74, 79; 345/197

[56] References Cited

U.S. PATENT DOCUMENTS

| | | | |
|---|---|---|---|
| 3,483,400 | 12/1969 | Washizuka et al. | 377/74 |
| 3,576,447 | 4/1971 | McKenny | 377/79 |
| 3,676,709 | 7/1972 | Ducamus et al. | 377/79 |
| 4,084,106 | 4/1978 | Ullrich | 377/79 |
| 4,623,908 | 11/1986 | Oshima et al. | 257/66 |
| 5,136,622 | 8/1992 | Plus | 377/79 |
| 5,222,082 | 6/1993 | Plus | 377/79 |

FOREIGN PATENT DOCUMENTS

| | | |
|---|---|---|
| 0151077 | 8/1985 | European Pat. Off. . |
| 57-69596 | 4/1982 | Japan . |
| 58-219525 | 12/1983 | Japan . |
| 59-042696 | 3/1984 | Japan . |
| 60-70599 | 4/1985 | Japan . |
| 2213667 | 8/1989 | United Kingdom . |

OTHER PUBLICATIONS

Fischer, A., "Flache Fernseh–Bildschirme", ntz vol. 33, 1980, pp. 80–88.
Y. Oana, et al, 1984 SID Symposium Digest, pp. 312–315.
S. Morozumi, et al, 1984 SID Symposium Digest, pp. 316–319.
J. Onwada, et al, Conf. record of the 1988 Inter. Res. Conf., pp. 215–219.
B. W. Faughnan, et al, Proceedings of the SID, vol. 29/4, 1988, pp. 279–282.
I. De Rycke, et al, Conf. record of the 1988 Inter. Res. Conf., pp. 70–73.
M. Akiyama, et al, Japan Display 1986, pp. 212–215.
K. Khakzar, et al, Japan Display 1989, pp. 438–441.
Y. Nishihara, et al, 1992 SID Symposium Digest, pp. 609–612.
Dae M. Kim, et al, 1990 SID Sympoisum Diges, pp. 304–306.

Primary Examiner—John S. Heyman
Attorney, Agent, or Firm—Michael J. Striker

[57] ABSTRACT

The circuit device has a plurality of cascaded stages. Each cascaded stage includes several partial stages and has at most two capacitors ($C_{n1}$, $C_{nB}$) and at most seven transistors ($T_{n1}$, $T_{n2}$, $T_{n3}$, $T_{n4}$, $T_{n5}$, $T_{n6}$, $T_{n7}$). The circuit device includes a device for controlling the cascaded stages with four periodic clock signals ($\Phi_1$, $\Phi_2$, $\Phi_3$, $_{101}$ $_4$) phase-shifted about 90° relative to each other such that each of the cascaded stages is controlled by a respective assigned one of four predetermined sets of two of the four periodic clock signals and the same one of the four predetermined set repeats every fifth cascaded stage. Each cascaded stage includes an output stage (12, 12') including a bootstrap-capacitor ($C_{nB}$) and three transistors ($T_{n5}$, $T_{n6}$, $T_{n7}$) electrically connected to the bootstrap-capacitor ($C_{nB}$); and a charging and discharging stage (11) for the bootstrap-capacitor ($C_{nB}$). The charging and discharging stage (11) includes at least one transistor ($T_{n4}$) connected electrically to the bootstrap capacitor ($C_{nB}$). Each cascaded stage can advantageously also include an inverter stage connected to the charging and discharging stage and including two transistors ($T_{n1}$, $T_{n2}$) and a memory capacitor ($C_{n1}$) electrically connected with each other and controlled by an input signal so that so that both transistors ($T_{n1}$, $T_{n2}$) are never simultaneously conducting.

9 Claims, 10 Drawing Sheets

CIRCUIT DEVICE FOR CONTROLLING CIRCUIT COMPONENTS CONNECTED IN SERIES OR IN A MATRIX-LIKE NETWORK

BACKGROUND OF THE INVENTION

The present invention relates to an electronic circuit for controlling circuit components connected electrically in series or in a matrix-like network which is part of a shift register.

Controlling such serially connected or matrix connected circuit components is necessary for addressing the row and column conductors of a liquid crystal display screen. Such active-matrix liquid crystal-display screens (so-called AM-LCDs) are to be used increasingly in the future to replace display devices with cathode ray tubes in television and data processing, since they have a number of advantages: reduced weight, flat structure, no distortion of the picture produced, low control voltages, reduced power consumption, possible use as a light valve in a projector, high resolution, no generated X-radiation as in the case of a cathode ray tube, no strong magnetic and electric fields originating from the display device and economical manufacture, which is particularly suitable for large screen applications.

Liquid crystal-display screens have a matrix-like arrangement of image spots. Each image spot is associated with a circuit component. The circuit components are multiple thin film transistors. The image information is fed to the columns and is written line-wise into the image spot memory by the circuit components. Thus the lines or rows must be controlled so that only one line conductor of the N lines of the display screen has a sufficiently high potential for 1/N-th of the image display time, so that the image spot capacitance can be changed to the data voltage corresponding to the image information by the circuit component. It must be guaranteed that the image spot capacitance cannot be discharged by the circuit component during the remaining image repetition time.

In many applications, e.g. in display screens with a comparatively large number of image spots and/or smaller image size it is advantageous to integrate the circuit arrangement for controlling the line or row conductors in the display screen substrate. This requires that the circuit arrangement be manufactured in the same technology as the display screen matrix.

Few methods of integration of shift registers for matrix addressing directly in the glass substrate in a technology compatible with the manufacturing method of the display screen device are described in the literature (Y. Oana et al.: 1984 SID Symposium Digest pp. 312–315; S. Morozumi et al.: 1984 SID Symposium Digest pp. 316–319; J. Ohwada et al.: Conf. Record of the 1988 Inter. Res. Conf. pp. 215–219; B. W. Faughnan et al.: Proc. of the SID Vol. 29/4 1988 pp. 279–282; I. De Rycke et al.: Conf. Record of the 1988 Inter. Res. Conf. pp. 70–73; M. Akiyama et al.: Japan Display 1986, pp. 212–215; K. Khakzar et al.: Japan Display 1989 pp. 438–441; Y. Nishihara et al.: 1992 SID symposium Digest pp. 609–612; Dae M. Kim et al.: 1990 SID Symposium Digest pp. 304–306). These driver circuits comprise an N-stage shift register and N-output driver stages, in which N is the number of lines of the liquid crystal-display screen. The output stages must be in a position to rapidly charge and discharge the capacitive load to be driven, which is composed of the input capacitance of the circuit components and the cross-over capacitance of the line and column conductors.

From the literature both static shift registers (Y. Oana et al.: 1984 SID Symposium Digest pp. 312–315; S. Morozumi et al.: 1984 SID Symposium Digest pp. 316–319,; B. W. Faughnan et al.: Proc. of the SID Vol. 29/4 1988 pp. 279–282; M. Akiyama et al.: Japan Display 1986 pp. 212–215, Y. Nishihara 1992 SID Symposium Digest pp. 609–612) and also dynamic shift register (S. Morozumi et al.: 1984 SID Symposium Digest pp. 316–319; J. Ohwada et al.: Conf. Record of the 1988 Inter. Res. Conf., pp. 215–219; I. DeRycke et al.: Conf. Record of the d1988 Inter. Res. Conf. pp. 70–73; K. Khakzar et al.: Japan Display 1989 pp. 438–441) are known for addressing the line and column conductors of a display screen. One stage of a static shift register generally comprises two bistable sweep circuits which include at least 12 transistors, e.g. in thin layer technology. Dynamic shift register stages comprise two serially connected inverters and need only four to six transistors (4 transistors for example in the device described in K. Khakzar, Japan Display 1989, pp. 438–441). Similarly several different devices are known for the additionally required output driver stages. One simple device as described in Y. Oana et al.: 1984 SID Symposium Digest pp. 312 to 315 comprises two serially connected inverters. Also the so-called push-pull stages, which have two broad-band thin film transistors, are used as an output driver stage. Several inverter stages (see J. Ohwada et al. :Conf. Record of the 1988 Inter. Res. Conf. pp. 215–2319; B. W. Faughn et al.: Proc. of the SID Vol. 29/4 1988 pp. 279–282; M. Akiyama et al.: Japan Display 1986 pp. 212–215) or amplifier circuits (see J. Ohwada et al.: Conf. Record of the 1988 Inter. Res. Conf. pp. 70–73) are included in the shift registers and push-pull stages. Only at times one transistor of the push-pull stage is conducting and connects the output either with a high or a low potential.

In the case of line control the total number of required transistors per line control stage increases to about 4 to 12 because of the necessary additional output stages. Also very extensive control circuits are required because display screens with greater resolution or definition have a correspondingly larger number of lines and columns (about 500 to 2000). The same problem results naturally for serially connected arrangements of circuit components, for example the circuit components for reading out the signals of an image scanner sensor line or circuit components for control of switching transistors of a press device.

SUMMARY OF THE INVENTION

It is an object of the present invention to provide a circuit device, particularly for controlling the data conductors of a liquid crystal-display screen, which has a simple structure and enables a high manufacturing production rate.

According to the invention, the circuit device includes at most seven transistors and at most two capacitors and means for control by four periodic signals, which are phase shifted by about 90° to each other.

During the addressing of a matrix the shift register forms the core of the controlling device for the lines and columns. For this type of addressing in most cases it is not necessary to admit arbitrary input pulse trains. It is sufficient to shift one input pulse through all stages of the shift register prior to applying the next input pulse to the input of the first stage. Only a maximum of seven transistors and two capacitors per shift register stage are required because of the four phase periodic signals and the special input pulse sequence. In one preferred embodiment serval transistors are included in an output stage together with a capacitor acting as a bootstrap-capacitor and at least one other transistor is included in a charging and discharging stage of the bootstrap-capacitor. Large capacitive loads can be driven with the circuit device using the bootstrap-capacitor. In an additional modification of the circuit device according to the invention the circuit device can have an inverter formed from an additional capacitor and two transistors to obtain a high-resistance output from the circuit device. Thus both transistors are never simultaneously conducting so that no static crosscurrent flows. The power loss of a shift register with this type of circuit arrangement is thus only dependent on the shift frequency. Additional advantages result, when the transistors together act as a circuit means or switch. The circuit device is very noise insensitive because of that. Furthermore the dimensions of all the transistors can be large which leads to an improved control of the manufacturing process and thus to an increased manufacturing output. The transistors can be field effect transistors of the N-MOS-enriched type, in which the gate dielectric of the transistors can be appropriately an insulator. This leads to a simple manufacturing process and to a higher manufacturing output in large surface thin layer technology applications. Special advantages result when the circuit device according to the invention is used for control of lines and/or column conductors of the liquid crystal-display screen; the circuit device of the invention is however not limited to that application.

BRIEF DESCRIPTION OF THE DRAWING

The objects, features and advantages of the invention will now be illustrated by the following preferred embodiments in the detailed description, reference being made to the drawing in which.

DESCRIPTION OF THE PREFERRED EMBODIMENTS

Figure 1:
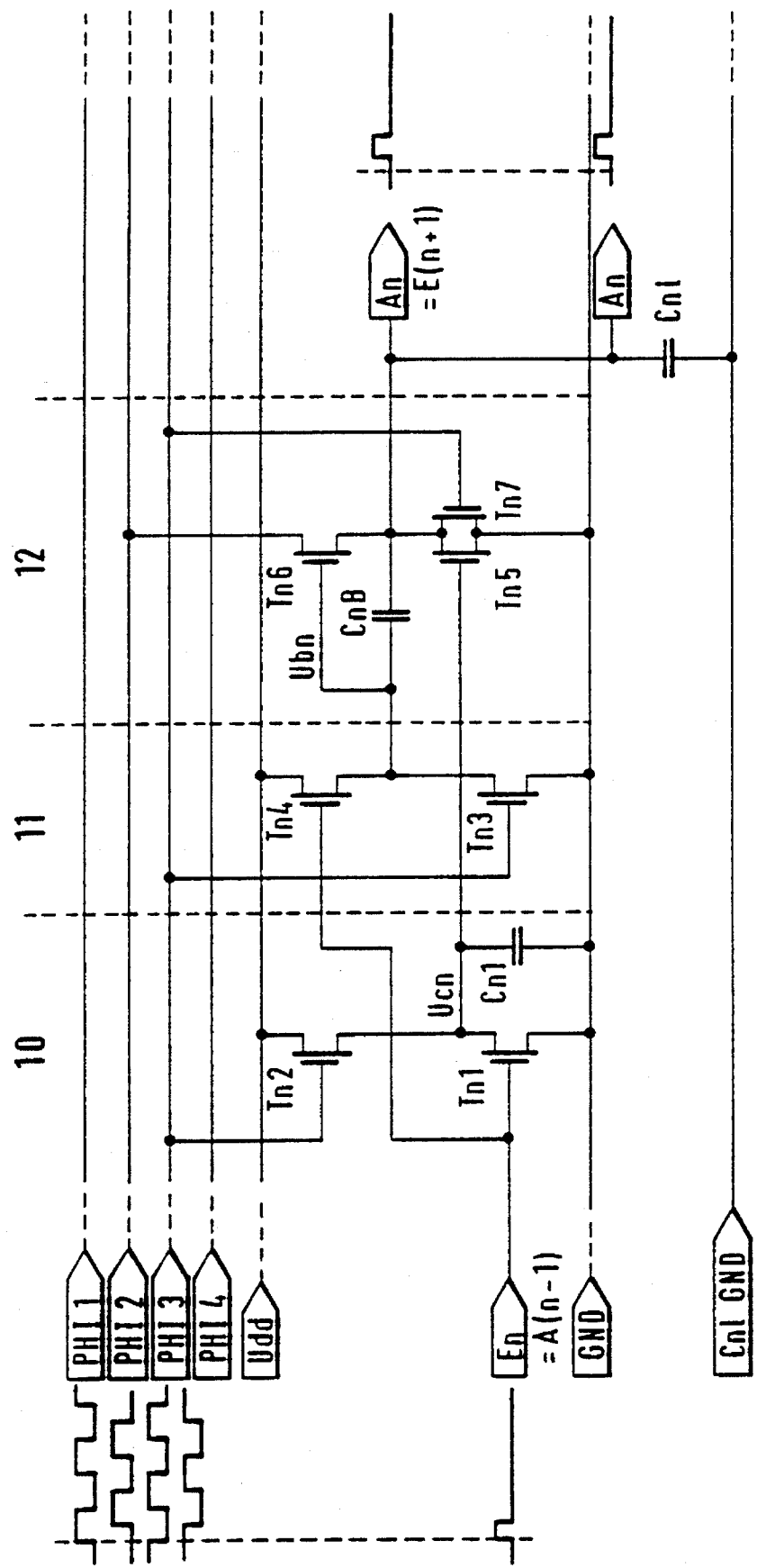
FIG. 1 is a circuit diagram of a first embodiment of the circuit device according to the invention for the nth stage of a dynamic shift register.

FIG. 1 shows one embodiment of a circuit arrangement according to the invention as an nth stage of a dynamic shift register. The shift register is controlled by four periodic signals $\Phi_1$, $\Phi_2$, $\Phi_3$ and $\Phi_4$, which are applied to the terminals PHI1–PHI4 and those form is sketched at the left hand side of the terminals PHI1–PHI4. The periodic signals $\Phi_1$, $\Phi_2$, $\Phi_3$ and $\Phi_4$ are phase shifted 90° relative to each other. The periodic signal pairs $\Phi_1/\Phi_3$ and $\Phi_2/\Phi_4$ are not overlapped so that no cross-current occurs in the circuit device. Furthermore the circuit device is provided with a constant supply voltage $U_{dd}$.

Figure 2:
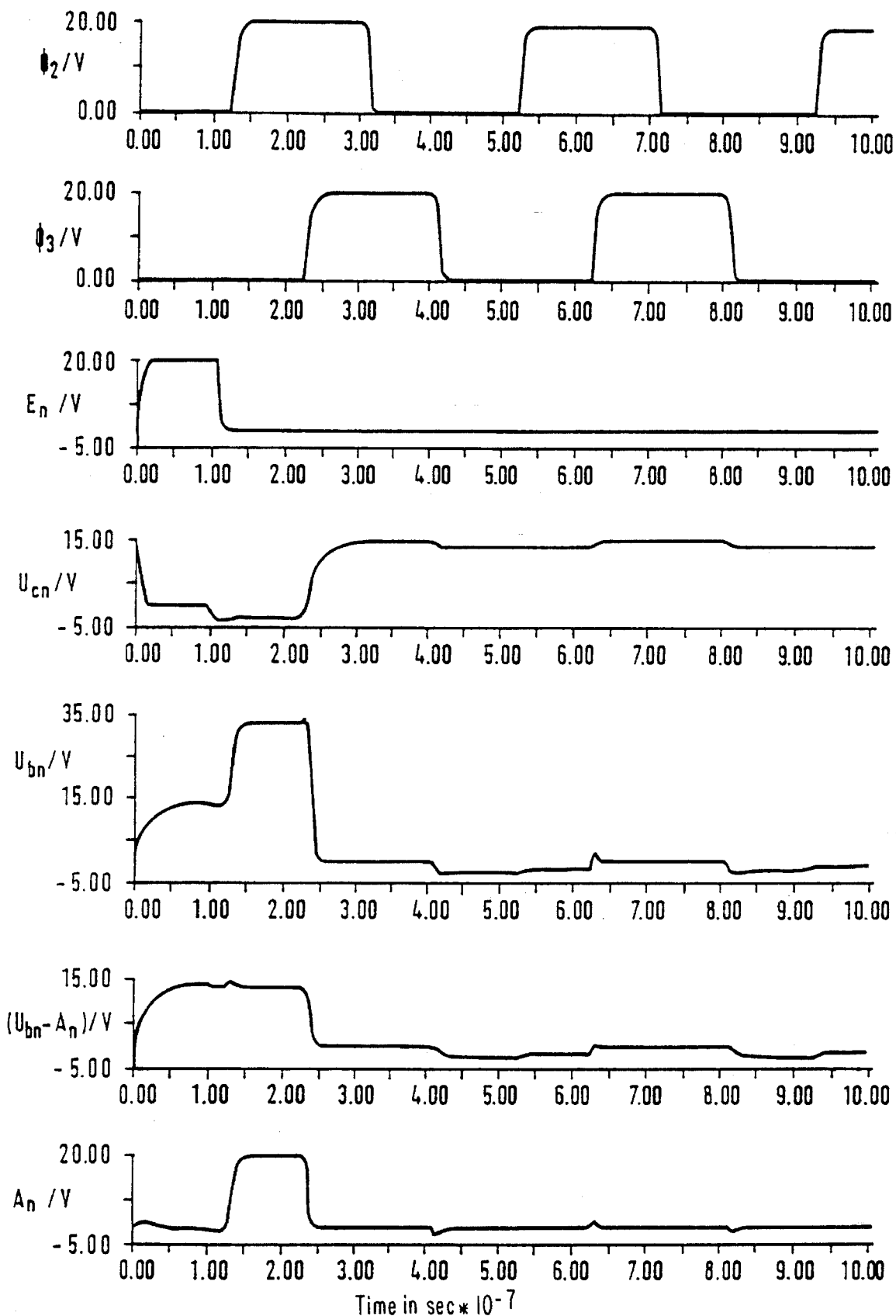
FIG. 2 is a pulse diagram for the circuit device of FIG. 1 at a shift frequency of 10 MHz.

The shift register according to FIG. 1 is divided into three partial stages: an inverter stage 10, a bootstrap-capacitor charging and discharging stage 11 and an output stage 12. The inverter stage 10 comprises two transistors $T_{n1}$, $T_{n2}$ and the capacitor $C_{n1}$. The transistor $T_{n2}$ charges the capacitor $C_{n1}$ periodically during the high level of the periodic signal $\Phi_3$. By selecting the periodic voltage $U_{\Phi3} > U_{dd} + U_{th}$, where $U_{th}$ is the threshold voltage of the transistors, the transistor $T_{n2}$ operates very quickly to the voltage $U_{dd}$. The discharging of the capacitor $C_{n1}$ in the "initial or starting region" and charges the capacitor $C_{n1}$ occurs through the transistor $T_{n1}$, when it is switched by an input signal $E_n$. From the pulse diagram of FIG. 2 it is apparent that the signals $\Phi_3$ and $E_n$ never have a high level simultaneously to guarantee that $T_{n1}$ and $T_{n2}$ are never simultaneously conducting and as a result only very small cross-currents, namely the blocking current of the field effect transistors, flows. In the shift register circuit used currently with field effect transistors of the n-MOS-enriched type, particularly those with two-phase pulses, the transistor $T_{n2}$ is used as a load element. Furthermore gates and drains of the transistor $T_{n2}$ are jointly connected to the pulse voltage so that the transistor $T_{n2}$ is exclusively operated in the "saturated" condition. As a result the memory capacitor $C_{n1}$ is charged only to a voltage $U_{C''} = U_{\Phi2} - U_{th}$. Which also depends on the threshold voltage $U_{th}$. Furthermore the low-output level of the conventional inverter circuit is determined by the ratio of the quotient of the channel length and channel width of the load and switching transistors and thus is always greater than 0 V. In contrast the transistors $T_{n1}$ and $T_{n2}$ of the circuit shown in FIG. 1 only have the function of a switch for discharging and/or charging the memory capacitor $C_{n1}$. The inverter output voltage $U_{Cn}$ does not depend on the geometry and the threshold voltage $U_{th}$ of the transistors $T_{n1}$ and $T_{n2}$, when $U_{\Phi1} > U_{dd} + U_{th}$ is chosen. Only the side steepness of the output pulse $U_{Cn}$ is influenced by the threshold voltage $U_{th}$. The circuit reliability for subsequent shift register stages is thus substantially increased.

The bootstrap capacitor charging and discharging stage 11 comprises only two transistors $T_{n3}$ and $T_{n4}$. The bootstrap capacitor $C_{nB}$ is charged to a constant voltage $U_{dd}$ during a high level of the signal $E_n$ by the transistor $T_{n4}$. This guarantees that the voltage $U_{dd}$ is at least about the periodic voltage $U_{\Phi1}$ less than the threshold voltage $U_{th}$ and the channel width of the transistor $T_{n4}$ is adjusted to the size of the capacitor $C_{nB}$. The bootstrap capacitor $C_{nB}$ is again discharged by the transistor $T_{n3}$, which is controlled by the periodic signal $\Phi_3$. Thus it is guaranteed that both transistors $T_{n3}$ and $T_{n4}$ are not simultaneously conducting.

The output stage 12 comprises three transistors $T_{n5}$, $T_{n6}$ and $T_{n7}$ and the bootstrap capacitor $C_{nB}$. The transistor $T_{n6}$ is made conducting by charging the capacitor $C_{n8}$ by the transistor $T_{n4}$. The transistors $T_{n3}$ and $T_{n4}$ remain blocked after the capacitor $C_{nB}$ is charged so that the gate-source voltage at transistor $T_{n6}$ remains constant because of the charged capacitor $C_{nB}$. The potential at the output $A_n$ increases with an increasing potential of the periodic signal $\Phi_2$ (see FIG. 2). Simultaneously potential at the output $A_n$ is fed back to the transistor $T_{n6}$ or coupled with the the gate potential at transistor $T_{n6}$ by $C_{nB}$, which also causes this potential to exceed the potential of the periodic signal $\Phi_2$ by about the charging voltage $U_{bn}-A_n^*$ at the capacitor $C_{nB}$. As a result of that the channel of the transistor $T_{n6}$ becomes extremely low-resistance, whereby a rapid charging of a load capacitor $C_{nL}$ arranged at the output of the output stage 12 is guaranteed. The load capacitor $C_{nL}$ is discharged through the transistor $T_{n5}$ and the output is low-resistance. Thus it is guaranteed that no noise pulses eventually coupled in are shifted to the next stage of the shift register. The transistor $T_{n7}$ connected in parallel to the transistor $T_{n5}$ is controlled directly by the periodic signal $\Phi_3$ and has the purpose of increasing the steepness of the decreasing potential side of the output pulse $A_n$ to keep the overlap of the output pulse $A_n$ as small as possible so that only a minimal cross-current flows.

Figure 3:
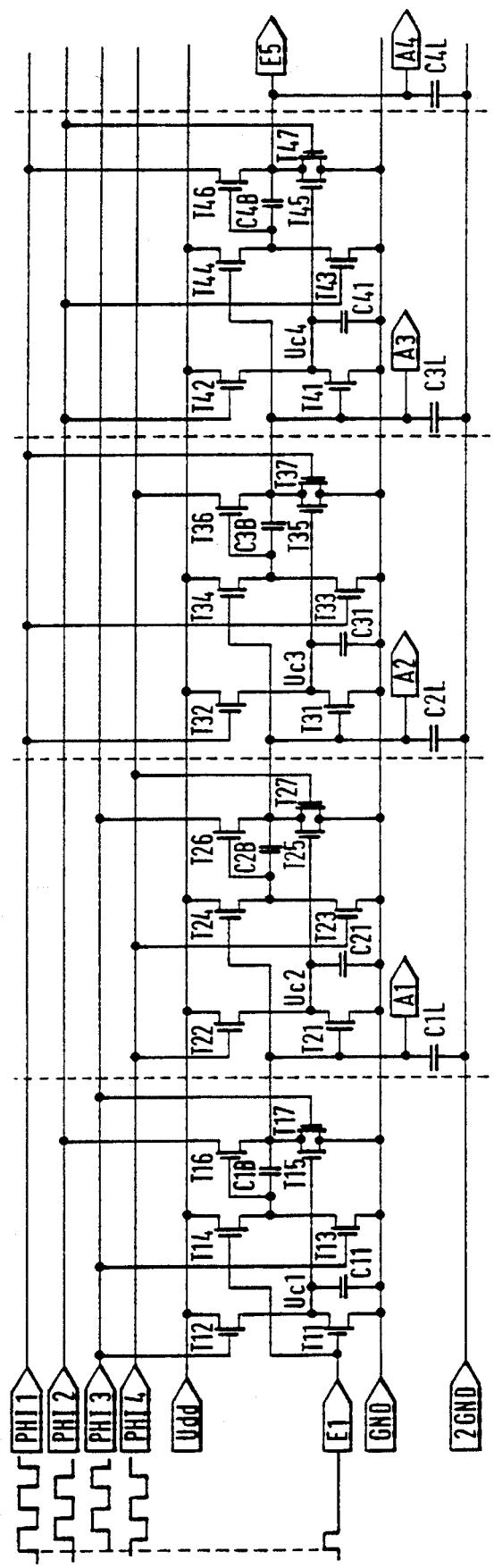
FIG. 3 is a circuit diagram of four stages of a dynamic shift register and their relationship to the four phase periodic signals.

In FIG. 3 the structure of the column shift register having four stages with a circuit device as shown in FIG. 1 is illustrated, which periodically repeats because of the four-phase cycle after the four stages shown.

Figure 4:
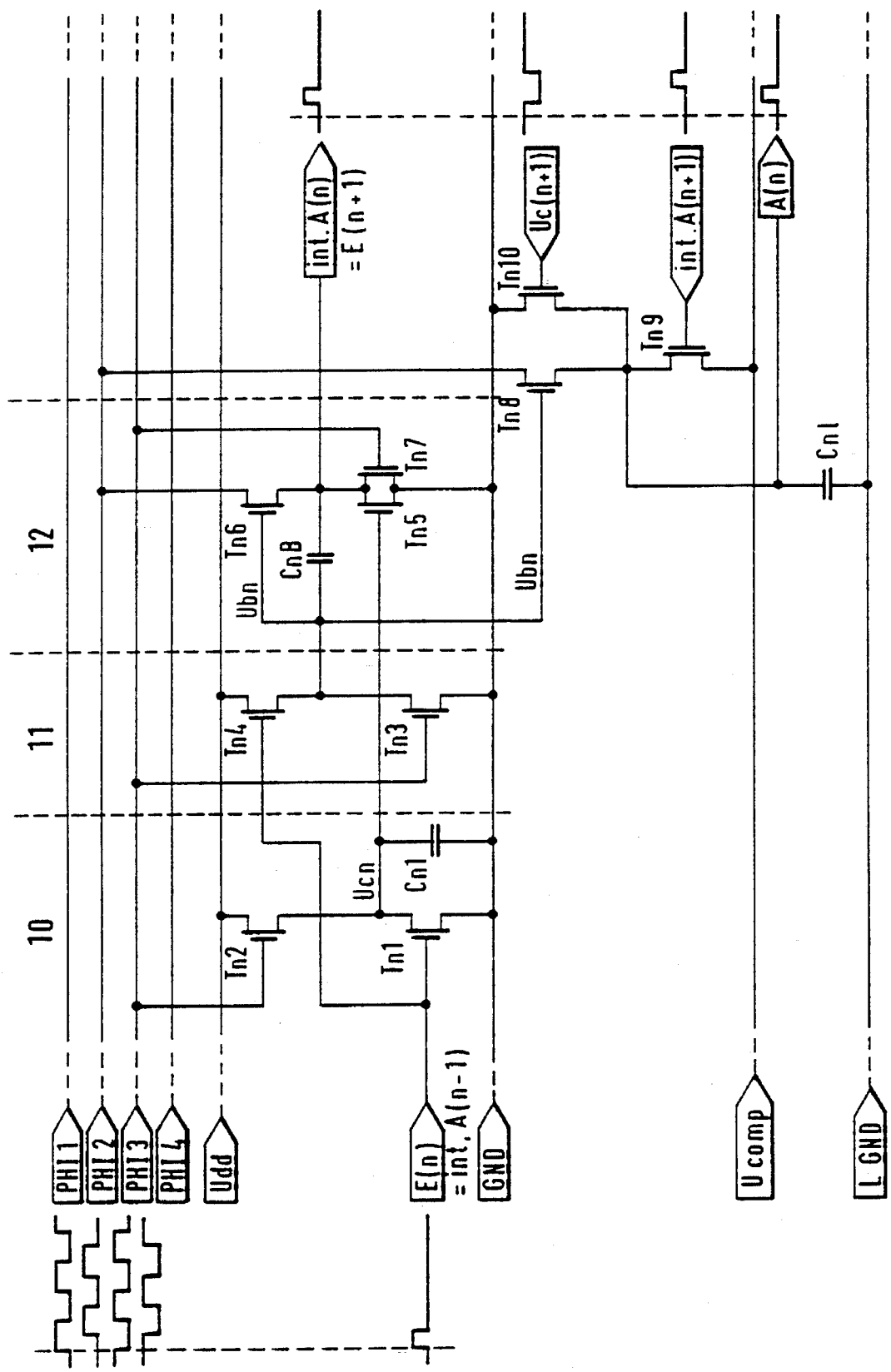
FIG. 4 is a circuit diagram showing the embodiment of FIG. 1 being used for a reverse pulsing line driver.
Figure 5:
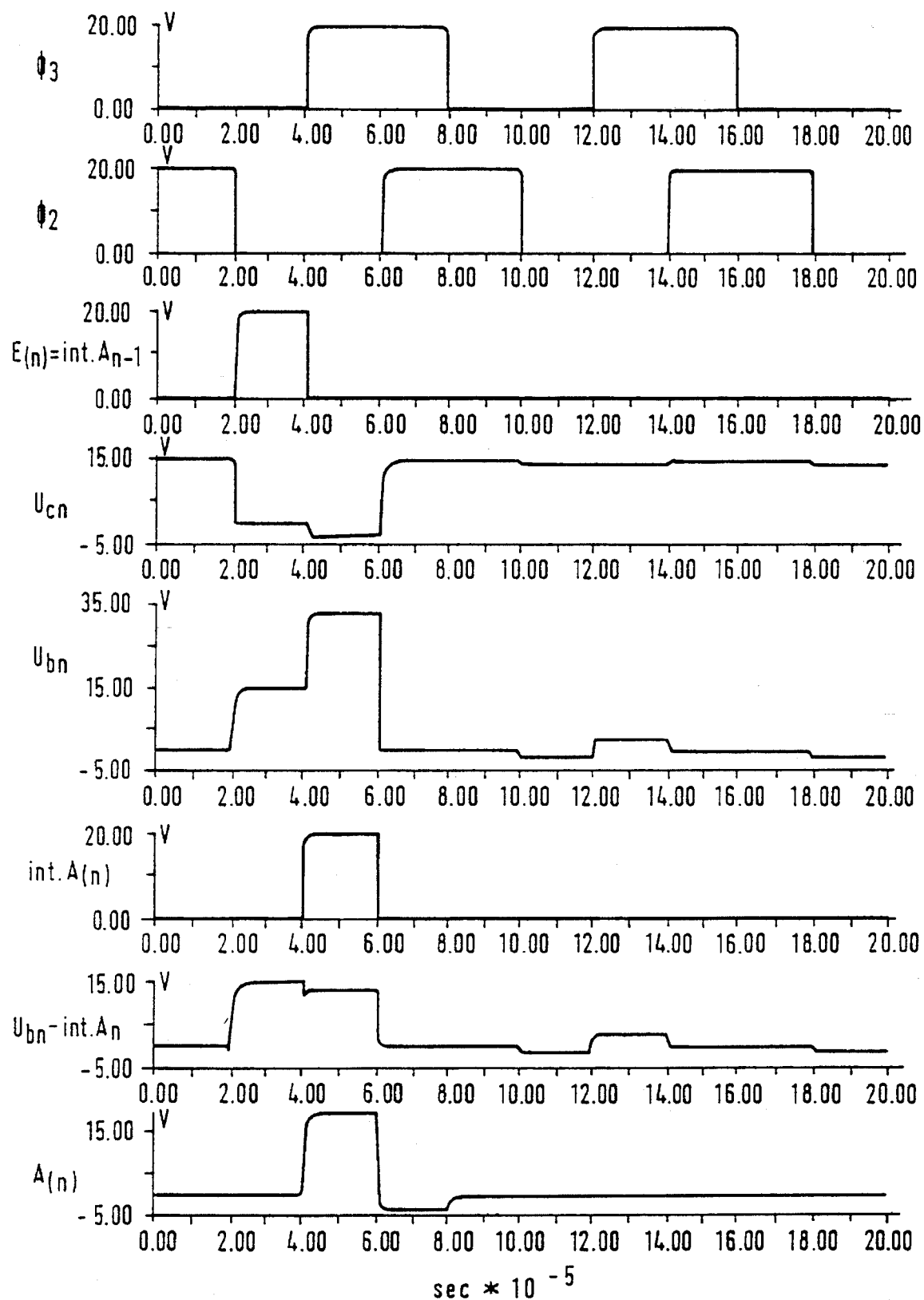
FIG. 5 is a pulse diagram for pulses of the reverse pulsing line driver of FIG. 4.

Driver circuits with the ability to control a high load capacity are required for controlling the lines of liquid crystal display screens. Above all, in high resolution active liquid crystal-display screens load capacitances of over 100 pF occur at the output of line drivers by the high number of crossover between lines and column conductors. Furthermore the line driver required for active liquid crystal-display screens requires a low-resistance output at all times so as to prevent occurrence of noise pulses by coupling by the cross-capacitances between column and line conductors, which can lead to an undesired control of not selected display screen lines. In FIG. 4 such a line driver is shown, which has a circuit device according to FIG. 1. This line driver supplies not only a selection pulse $A_{(n)}$ at the output, but additionally a counter pulse for compensation of capacitive noise in the active display screen matrix after the selection pulse $A_{(n)}$. This principle of compensation is already described in the Literature (see K. Suzuki, Eurodisplay 1987, pp. 107–110; Y. Kaneko et al.: IEEE Transactions On Devices, Vol. 36, No. 12, 1989). The circuit device with the components $T_{n1}$, $T_{n2}$, $T_{n3}$, $T_{n4}$, $T_{n5}$, $T_{n6}$, $T_{n7}$, $C_{n1}$ and $C_{nB}$ is identical with the circuit the circuit shown in FIG. 1. As shown in FIG. 5, the control signals and signals in the circuit shown in FIG. 4 behave according to the same principle as those in the circuit of FIG. 1. The circuit shown in FIG. 1 must only be expanded by one line driver output stage including three transistors $T_{n8}$, $T_{n9}$ and $T_{n10}$ to provide a complete line driver stage. Thus only ten transistors are required in the complete line driver stage. Up to now only line driver circuits with at least fourteen transistors per stage were known from the literature.

The operation of the three additional transistors $T_{n8}$, $T_{n9}$ and $T_{n10}$ can be understood in reference to FIG. 4 and the pulse diagram of FIG. 5. The transistor $T_{n8}$ is appropriate for switching through the selection pulses with the amplitude of $\Phi_2$, while the transistor $T_{n9}$ produces a counter pulse by switching on a compensating voltage $U_{comp}$. The transistor $T_{n10}$ keeps the line driver output $A_{(n)}$ at the ground potential (GND-potential—see FIG. 5). The transistor $T_{n8}$, which responds to the selection pulse, obtains its gate control signal $U_{bn}$ from the bootstrap capacitor $C_{nB}$. The gate transistor $T_{n9}$ is controlled by internal output signal int. $A_{(n+1)}$ of the subsequent shift register stage. The transistor $T_{n10}$ draws its gate potential control signal from output $U_{c(n+1)}$ of the inverter stage of the following shift register stage. Both transistors $T_{n9}$ and $T_{n10}$ require signals for the next shift register stage so that in building the line driver circuits one always must provide more shift register stages than outputs.

The compensating voltage $U_{comp}$ is selected so that it is usually very small, smaller than the threshold voltage $U_{th}$ of the transistors. Also one must guarantee that, apart from the charging current and leakage current, the cross-current is approximately zero.

Figure 6:
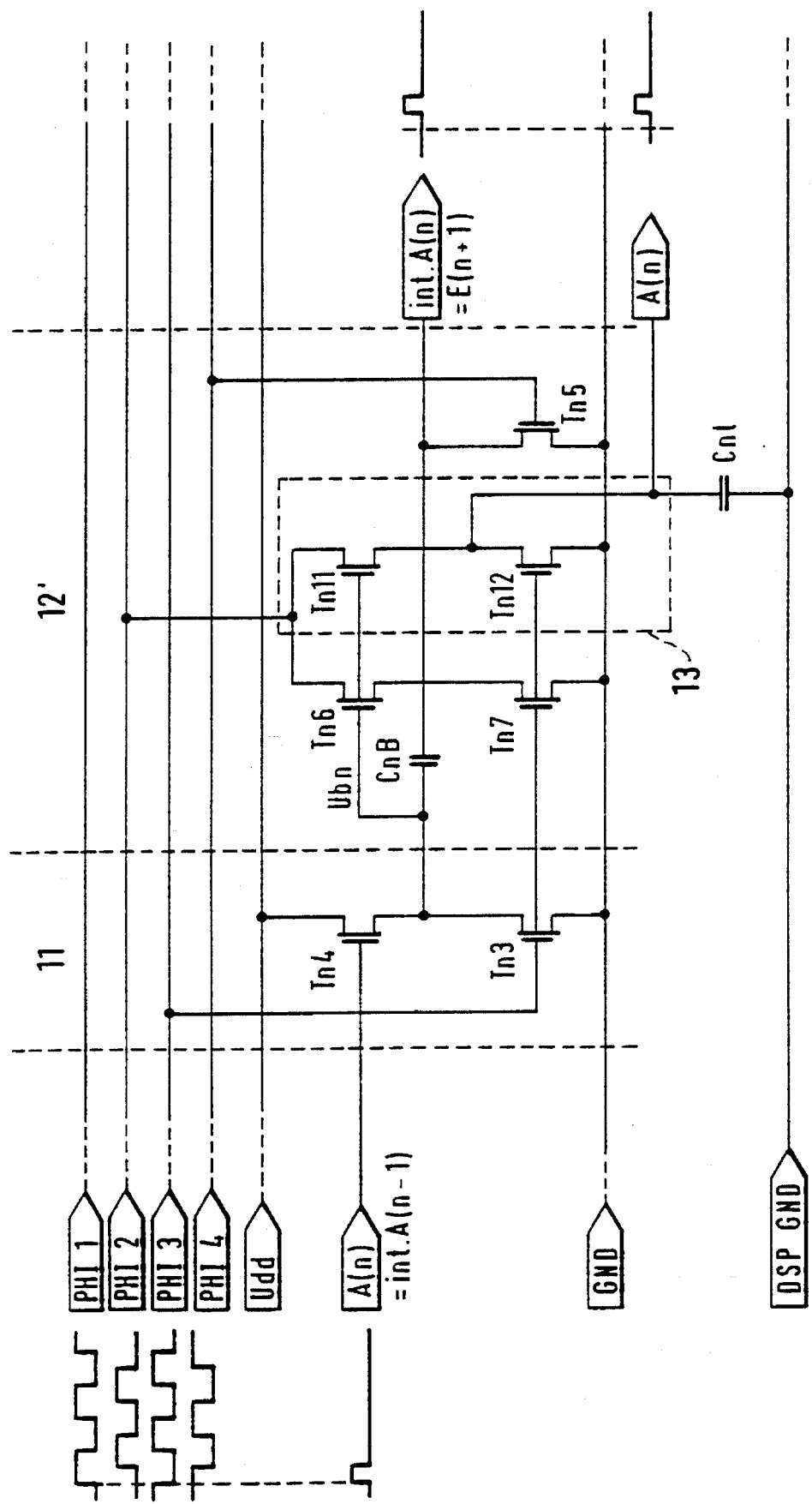
FIG. 6 is a circuit diagram showing the use of a second embodiment of the circuit device according to the invention in a shift register without permanent low-resistance output.

In many applications it is not required that the shift register output is always low-resistance or low-impedance. This is, for example, not the case, when the capacitive behavior at the output and the capacitive coupling at the output are such that they cannot lead to disturbance of the shift operation of the shift register. In this case the circuit device of FIG. 1 can be dropped at the inverter stage 10. As a result two transistors and a capacitor can be eliminated so that the space requirements of the circuit arrangement are reduced and the manufacturing output can be increased because of the reduced number of components used in the circuit. FIG. 6 shows this embodiment of the circuit device shown in FIG. 1 for the shift register application. Thus in FIGS. 1 and 6 the same components are provided with the same reference number. The transistors $T_{n3}$ and $T_{n4}$ again form a bootstrap capacitor charging and discharging stage 11 and the transistors $T_{n11}$, $T_{n12}$, $T_{n5}$, $T_{n6}$ and $T_{n7}$ and the capacitor $C_{nB}$ form an internal output stage 12' with a decoupled output stage 13 to a videodriver. The gate of the transistor $T_{n5}$ can no longer be connected to the inverter output and is connected with the periodic signal $\Phi_4$. The transistors $T_{n5}$ and $T_{n7}$ thus guarantee that the internal output int.$A_{(n)}$ with the exception of the period segments, in which an output pulse is to be expected, is low-resistance. The shift register circuit according to FIG. 6, which is put together from the charging and discharging stage 11 and the output stage 12', comprises the five transistors ($T_{n3}$, $T_{n4}$, $T_{n5}$, $T_{n6}$, $T_{n7}$) and a capacitor ($C_{nB}$). An output stage 13, which is formed by the transistors $T_{n11}$ and $T_{n12}$ is used for decoupling the output stage from the transistors $T_{n5}$, $T_{n6}$ and $T_{n7}$. The decoupled output stage 13 is provided with the same signals as the transistors $T_{n6}$ and $T_{n7}$ (see FIG. 6). The decoupling offers the advantage that the fluctuations of the output load do not substantially effect the internal output signal int.$A_{(n)}$.

Figure 7:
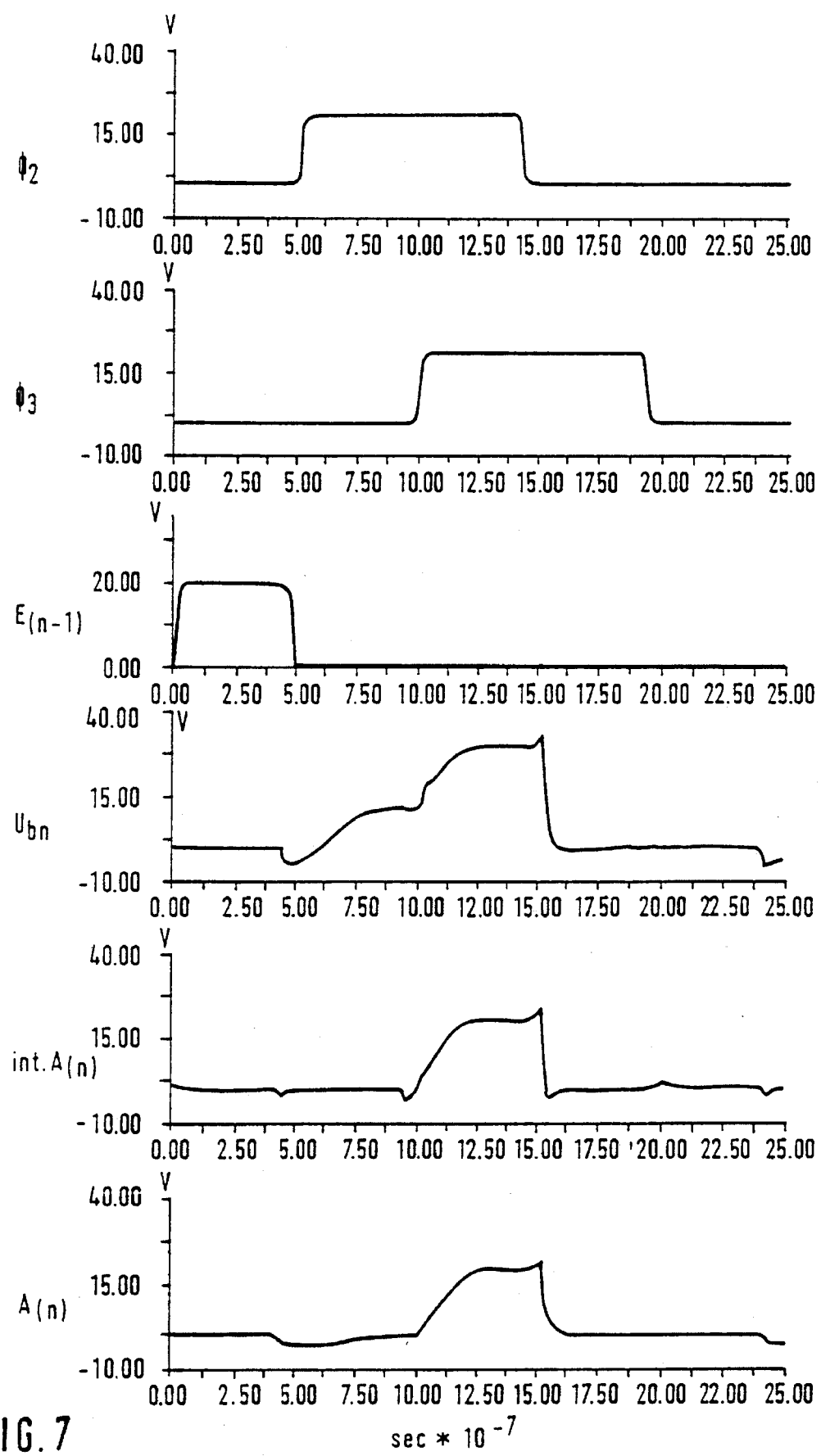
FIG. 7 is a pulse diagram for the circuit shown in FIG. 6.

The voltage pulse-time behavior in the additional following stages occurs in a manner analogous to that shown in FIG. 3. The pulse diagram of the circuit structure of FIG. 6 is shown in FIG. 7. They differ in principle only slightly from those shown in FIG. 2. The difference consists in the first place in a time interval which is characterized by the high resistance of the output nodule.

Figure 8:
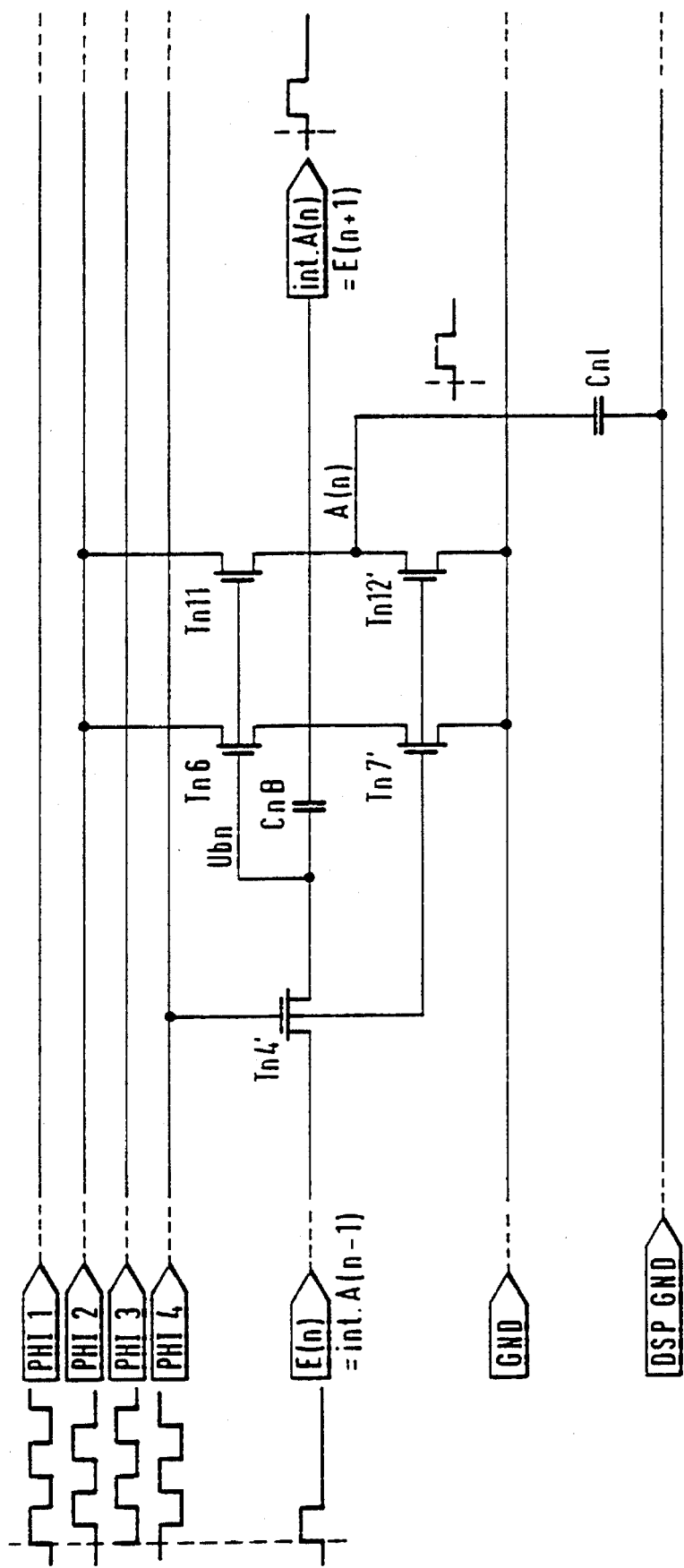
FIG. 8 is a circuit diagram of a shift register including a third embodiment of the circuit arrangement of the invention with very much smaller number of transistors.
Figure 9:
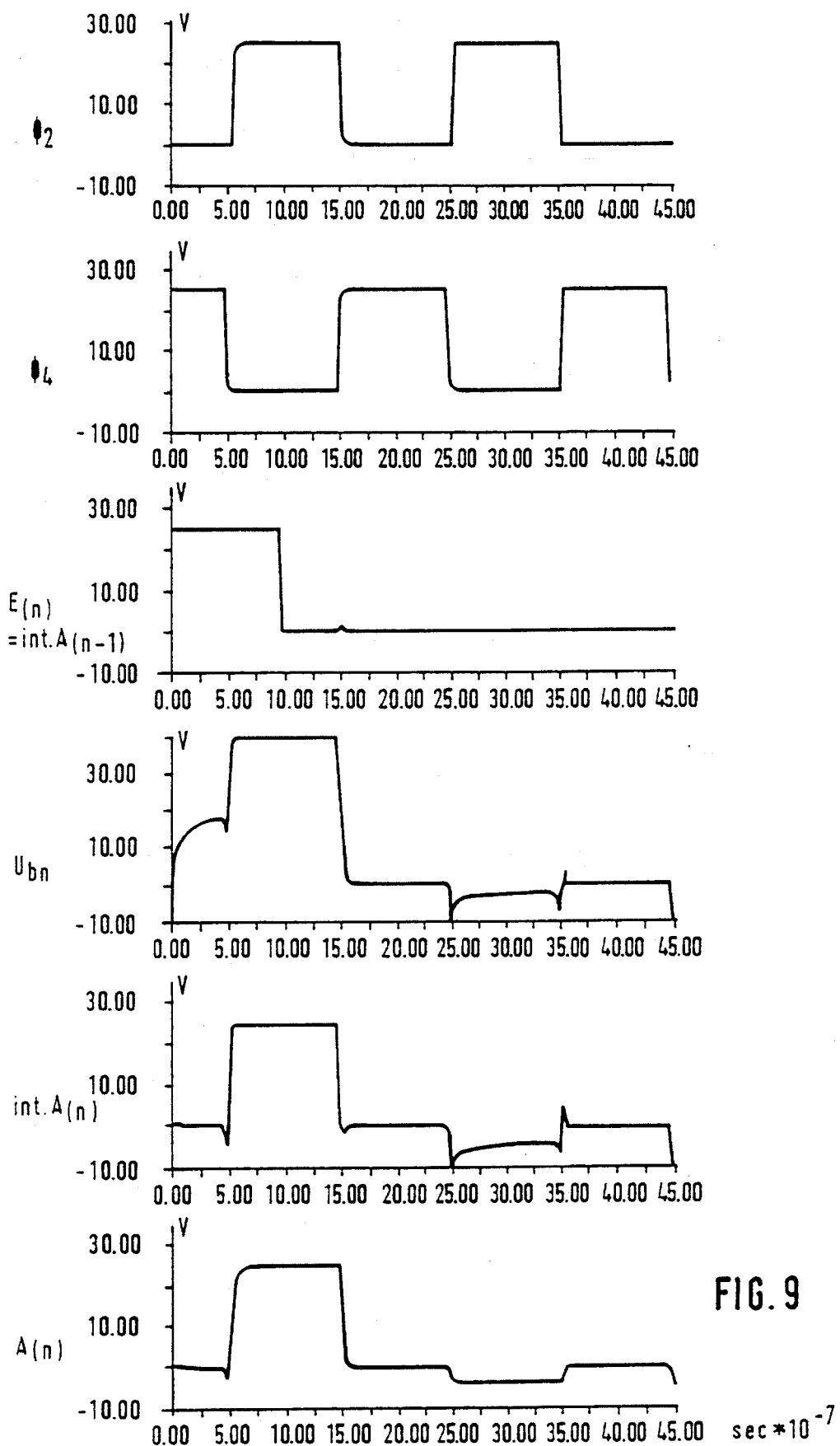
FIG. 9 is a pulse diagram for the circuit shown in FIG. 8.
Figure 10:
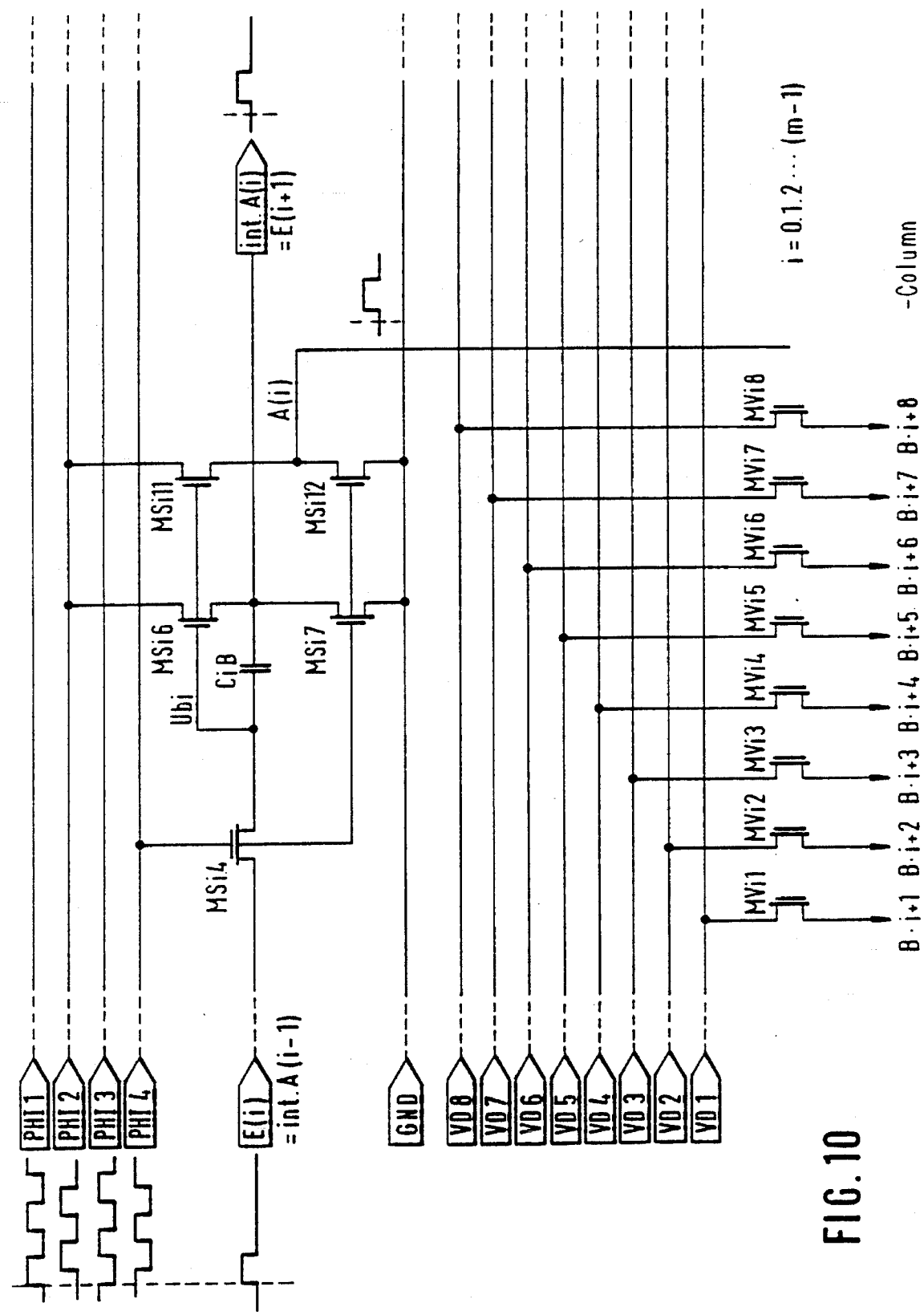
FIG. 10 is a circuit diagram showing the use of the circuit device according to the invention as shown in FIG. 8 in a column driver for a liquid crystal-display screen with analog switching.

The embodiment shown in FIG. 8, which has a minimum number of transistors per shift register stage, is based on the modification shown in FIG. 6. The supplied periodic signals are identical with those supplied to the circuit according to FIG. 6. The constant voltage $U_{dd}$ is not necessary in the circuit according to FIG. 8, since the bootstrap charging and discharging stage 11 formed from the transistors $T_{n3}$ and $T_{n4}$ in FIG. 6 can be replaced by a single transistor $T_{n4}'$. The gate of this transistor $T_{n4}'$ is controlled now by the periodic signal $\Phi_4$ and no longer by the periodic signal $\Phi_3$. The actual shift operation of the shift register is exclusively guaranteed by the three transistors $T_{n4}$, $T_{n6}$ and $T_{n7}$. The transistors $T_{n11}$ and $T_{n12}$, are included in a decoupled output driver stage of the shift register. The operation of the shift register is controlled by the same principle as in the shift register according to FIG. 6. The special feature of the shift register of FIG. 8 consists in the overlapping output signals $A_{(n-1)}$ and $A_{(n)}$ as seen in FIG. 9 from the pulse diagram of the signals $E_{(n)}[=A_{(n-1)}]$. A shift register as shown in FIG. 8 is not suitable for a line driver for control of a liquid crystal-display screen because of the overlapping output pulses and the high-resistance state at the output, but can be used in a column driver. FIG. 10 shows a simple type of such a column driver for a liquid crystal-display screen with analog switches MVi1–MVi8, which are grouped next to each other with eight columns in one group, are opened by a switch register of the type of FIG. 8 and input the analog video information to the columns. Instead of the shift register of FIG. 8 naturally also a shift register with a circuit device as shown in FIGS. 1 to 6 can also be used. The circuit device according to FIG. 8 however offers the advantage that the properties of the overlapping output pulses $A_{(n-1)}$ and $A_{(n)}$ can be used to increase the selection times of the analog switches MVi1 to MVi8. This provides the advantage that twice the time is available to charge the capacitance-bearing columns of the liquid crystal-display device.

Amorphous and polycrystalline semiconductor materials, e.g. a-Si:H amorphous and poly-Si and/or CdSe for polycrystalline semiconductor material usually used in thin layer technology are suitable for the above-described circuits.

We claim:

1. Circuit device for a shift register used to control circuit components connected electrically in a matrix-like network, said circuit device comprising a plurality of cascaded stages, each of said cascaded stages having at most two capacitors ($C_{n1}$, $C_{nB}$) and at most seven transistors ($T_{n1}$, $T_{n2}$, $T_{n3}$, $T_{n4}$, $T_{n5}$, $T_{n6}$, $T_{n7}$); and means for controlling said cascaded stages by four periodic clock signals ($\Phi_1$, $\Phi_2$, $\Phi_3$, $\Phi_4$), said periodic signals being phase-shifted about 90° relative to each other, wherein each of said cascaded stages is controlled by a different one of four predetermined sets of two of the four periodic clock signals and in which the same one of the four predetermined sets repeats every fifth one of said cascaded stages, and wherein each of said cascaded stages includes an output stage (12, 12') comprising an output ($A_n$) and one ($C_{nB}$) of said capacitors acting as a bootstrap-capacitor and three ($T_{n5}$, $T_{n6}$, $T_{n7}$) of said transistors electrically connected to one side of said bootstrap-capacitor with one of said three transistors having its gate electrode connected to the other side of said bootstrap-capacitor; and a charging and discharging stage (11) for said bootstrap-capacitor, said charging and discharging stage (11) being electrically connected to said output stage and including two ($T_{n3}$, $T_{n4}$) of said transistors forming said charging and discharging stage and connected electrically to said other side of said bootstrap-capacitor.

2. Circuit device as defined in claim 1, wherein each of said cascaded stages includes an inverter stage and said inverter stage comprises two ($T_{n1}$, $T_{n2}$) of said transistors and another ($C_{n1}$) of said capacitors acting as a memory capacitor, said two transistors ($T_{n1}$, $T_{n2}$) and said memory capacitor are electrically connected with each other and said inverter stage is connected to said charging and discharging stage.

3. Circuit device as defined in claim 2, wherein said two transistors ($T_{n1}$, $T_{n2}$) of said inverter stage are electrically connected in said inverter stage and controlled by supplying an input signal ($E_n$) to one of said two transistors ($T_{n1}$, $T_{n2}$) so that both of said transistors ($T_{n1}$, $T_{n2}$) are never simultaneously conducting.

4. Circuit device as defined in claim 1, wherein said transistors are connected so as to act as switching means.

5. Circuit device as defined in claim 1, wherein said transistors are n-MOS-enriched field effect transistors.

6. Circuit device as defined in claim 5, wherein said field effect transistors have a gate dielectric consisting of an insulator.

7. Circuit device as defined in claim 1, further comprising means for controlling line conductors of a liquid crystal-display screen.

8. Circuit device as defined in claim 1, further comprising means for controlling column conductors of a liquid crystal-display screen.

9. Circuit device as defined in claim 1, further comprising means for controlling column and line conductors of a liquid crystal-display screen.

* * * * *